United States Patent [19]
Palmer et al.

[11] Patent Number: 6,104,267
[45] Date of Patent: Aug. 15, 2000

[54] SURFACE MOUNT ELECTRONIC REED SWITCH COMPONENT WITH TRANSVERSE LEAD WIRE LOOPS

[75] Inventors: Edward R. Palmer, Sevenoaks; Colin Stratford, Croydon, both of United Kingdom

[73] Assignee: Standex International Corp., Salem, Mass.

[21] Appl. No.: 09/198,015

[22] Filed: Nov. 23, 1998

[30] Foreign Application Priority Data

Oct. 5, 1998 [GB] United Kingdom ............... 9821659

[51] Int. Cl.[7] ....................................................... H01H 1/66
[52] U.S. Cl. ........................... 335/151; 335/154; 174/260
[58] Field of Search .................................. 335/151, 202, 335/154; 174/51, 52; 31/260, 261; 361/400, 417, 760, 761, 763, 764; 439/698, 931, 68

[56] References Cited

U.S. PATENT DOCUMENTS

| | | |
|---|---|---|
| 2,392,311 | 1/1946 | Christopher . |
| 3,222,486 | 12/1965 | Moriyama et al. . |
| 3,249,728 | 5/1966 | Sasamoto et al. . |
| 3,302,143 | 1/1967 | Harkenrider . |
| 3,663,777 | 5/1972 | Steinmetz et al. . |
| 4,134,088 | 1/1979 | Asbell et al. . |
| 4,136,321 | 1/1979 | Smith . |
| 4,145,805 | 3/1979 | Smith . |
| 4,177,439 | 12/1979 | Smith . |
| 4,232,281 | 11/1980 | Smith . |
| 4,254,448 | 3/1981 | Martyniak . |
| 4,286,241 | 8/1981 | Olivenbaum et al. . |
| 4,339,644 | 7/1982 | Aldinger et al. . |
| 4,420,732 | 12/1983 | Jin . |
| 4,495,480 | 1/1985 | Martin et al. . |
| 4,588,974 | 5/1986 | Hill . |
| 4,611,092 | 9/1986 | Pederson, Jr. et al. . |
| 4,764,848 | 8/1988 | Simpson ............................. 361/408 |
| 4,831,724 | 5/1989 | Elliott . |
| 4,864,079 | 9/1989 | Barlow ............................... 174/52.1 |
| 5,128,834 | 7/1992 | Kaschke . |
| 5,291,375 | 3/1994 | Mukai . |
| 5,373,276 | 12/1994 | Suppelsa et al. .................... 336/65 |
| 5,453,582 | 9/1995 | Amano et al. . |
| 5,698,819 | 12/1997 | Brockett et al. .................... 174/52.1 |
| 5,768,770 | 6/1998 | Horton et al. ....................... 29/827 |
| 5,888,102 | 3/1999 | Strickland .......................... 439/698 |
| 5,917,707 | 6/1999 | Khandros et al. ................. 361/776 |

FOREIGN PATENT DOCUMENTS

| | | |
|---|---|---|
| 0131492 | 1/1985 | European Pat. Off. . |
| 0320013 | 12/1988 | European Pat. Off. . |
| 0750366 | 6/1995 | European Pat. Off. . |
| 2202682 | 9/1988 | United Kingdom . |
| 2253521 | 9/1992 | United Kingdom . |
| 2298316 | 8/1996 | United Kingdom . |

OTHER PUBLICATIONS

Search Report in Great Britain application Serial No. GB 9821659.1 (dated Jun. 1, 1999).

*Primary Examiner*—Lincoln Donovan
*Assistant Examiner*—Tuyen Nguyen
*Attorney, Agent, or Firm*—Wood Herron & Evans

[57] ABSTRACT

A surface mount electronic reed switch component (10) is provided having lead wires (12, 14) the outer ends of which are formed into associated loops (32, 34) that extend transversely to the seating plane (36) of the reed switch (10) to provide one or more stable surface mount feet (58) without undue bending stresses on the leads (12, 14) to thus avoid adversely affecting the switch gap (28) defined by the inner ends (22, 24) of the leads (12, 14).

41 Claims, 1 Drawing Sheet

SURFACE MOUNT ELECTRONIC REED SWITCH COMPONENT WITH TRANSVERSE LEAD WIRE LOOPS

BACKGROUND OF THE INVENTION

The present invention relates to surface mount electronic components, and more particularly, to surface mount reed switches.

By way of background, a conventional reed switch includes a pair of conductive switch contacts encapsulated within an elongated glass body which may have a cylindrical or rectangular cross-section extending along a longitudinal axis. The switch contacts are held in spaced-apart relationship to opposite sides of the longitudinal axis to define a carefully controlled gap therebetween. The ampere-turn or sensitivity rating of the reed switch corresponds to that gap. Typically, the switch contacts are defined at canted inner ends of a pair of conductive switch leads which extend along the longitudinal axis and out of the hermetically sealed glass body at opposed ends of the body.

The exposed outer ends of the leads may be electrically connected to conductive traces on a printed circuit (PC) board, for example, to interconnect with other electronic components. To this end, it has been conventional to form a 90° downward bend in the exposed end of each lead so as to be directed towards the PC board and in a vertical plane (as viewed with the switch mounted to the PC board) defined along the longitudinal axis of the reed switch, i.e., the seating plane of the switch. The lead is thus in-line with the reed switch seating plane and extends well beyond the cylinder of the switch body to be receivable through a conductive hole formed in the board after which the lead may be soldered in place.

To more densely and closely pack electronic components on PC boards, through-holes in the PC board are eliminated. Instead, surface mount technology (SMT) has been developed. With SMT technology, a small conductive pad is provided on the surface of the PC board and the lead of the electronic component is soldered directly to that pad without extending through the PC board. To this end, the leads of the electronic components may be bent twice at oppositely directed 90° angles along or parallel to the longitudinal axis to define a Z-shaped leg that extends along the seating plane of the reed switch. The lead is thus still in-line with the reed switch axis with the outermost end of the leg defining a flat or planar surface mount foot outside the cylinder of the switch body and oriented to extend along the seating plane of the switch. The surface mount foot rests directly in confronting relationship with the small contact pad on the surface of the PC board to make electrical contact therewith while also holding the electronic component above the board surface. Thereafter, the foot and contact pad are soldered together to secure the electrical connection.

Bending of the leads can place a stress on the associated electronic component. With respect to reed switches in particular, as the proximal end of each switch lead is bent close to the glass-to-metal seal to form the usual in-line surface mount foot at the distal end thereof, the result of stresses induced by bending may be seen at the inner end of the switch leads. Such stresses may adversely affect the hermetic sealing characteristics of the glass body or the predefined gap between the switch contacts causing erratic or inadequate performance of the reed switch.

In addition to the foregoing, because the in-line surface mount foot is typically defined along the length of the distal end of the lead itself, the width of the foot is usually relatively narrow. In reed switches, for example, where only two such feet are provided at extreme ends of the component body and are parallel to, but spaced from, the longitudinal axis thereof, the two narrow feet extend along the seating plane and so do not provide much stability to the reed switch resting on the PC board before it is soldered in place. An alternate SMT approach has been to provide an electronic component with a wide metal strip extending out of the body of the component, with the strip being bent into a C-shaped loop opening back towards the component in-line with the seating plane. While the bottom of the loop thus made provides a relatively wide surface mount foot, the use of such C-shaped in-line loops for reed switches continues to present bending stress problems and will not present any stability improvement due to the relatively thin wires used for reed switch leads.

One successful proposal to resolve the shortcomings set out above is shown in U.K. Patent Application Ser. No. 9503673.7 and U.S. Pat. No. 5,698,819. With the reed switch there-described, bending of the lead is eliminated by soldering a separate conductive pad element to the unbent lead to form a more stable surface mount foot without stressing the switch lead. While that construction is believed to be quite desirable, it does involve added manufacture and materials owing to the use of separate elements to define the surface mount feet.

SUMMARY OF THE INVENTION

It is an object of the present invention to provide a surface mount electronic component such as a surface mount reed switch which overcomes the above-mentioned problems related to stress on the leads, but without the need for separate components to define the surface mount feet, and without requiring wide lead elements extending out of the body of the component. To this end, a surface mount electronic component comprises a component body having a conductive lead wire extending outwardly therefrom along an axis, the axis lying in a seating plane of the component, and a conductive loop associated with the lead wire outside of the body and extending transverse to the seating plane so as to provide a surface mount foot spaced outside the switch body and extending in a direction transverse to the seating plane. The surface mount electronic component may be a reed switch having a reed switch body defining a cylinder and a pair of switch lead wires extending out of the body along a seating plane of the reed switch such that the inner ends of the switch lead wires define a switch gap within the reed switch body and along the seating plane, and including a conductive loop associated with each of the lead wires outside of the body, the conductive loops each extending transverse to the seating plane so as to provide for each lead wire a surface mount foot spaced outside the switch body and extending in a direction transverse to the seating plane.

The surface mount feet defined by the loop portion(s) provide a bearing surface which extends transverse to the body in a plane generally perpendicular to the longitudinal axis of the switch body for the length of the lead wire portion defining same. The surface mount foot thus defines a sufficiently wide bearing surface relative to the switch body to properly support same on the PC board surface notwithstanding that the lead wires are relatively thin. To this end, each surface mount foot portion is defined by bending the lead wire into a loop such that the foot portion extends in a direction that is at an angle to the seating plane, with the angle advantageously being about ninety degrees.

In one embodiment, each loop defines a C-shape that opens in a direction transverse to the seating plane rather than in-line therewith such that the distal end of the lead wire defines the surface mount foot. In that embodiment, a first or proximal portion of the lead wire is bent adjacent the glass body to extend in a direction transversely outward from the reed switch seating plane and a second or distal portion of the lead wire is bent at a location spaced from the glass body to extend outside the cylinder of the switch body in a direction opposite to the first portion. The second portion thus defines a PC board-facing surface mount foot extending transverse to the reed switch seating plane. The first and second lead switch portions may be connected by an included intermediate bight portion that is obliquely angled relative to the switch body axis so as to laterally offset the second portion outwardly of the reed switch body from the first lead wire portion. The offset may be adjusted to accommodate variations in the pad-to-pad spacing on the PC board.

In alternative embodiments, the loop may contain further bent portions that continue around the body so as to define multiple, rotationally offset surface mount feet transverse to the seating plane. To this end, the second portion of the lead wire extending beyond the seating plane joins to a third portion that bends back towards the body to define a second surface mount foot rotationally offset from the first foot. The third lead wire portion may join a fourth portion that bends again back toward the body to define a third surface mount foot rotationally offset from both of the first and second mounting feet. The second, third and fourth portions of the loop may be rotationally offset by about 120° each so as to define a triangular shape with each surface mount foot defining a respective leg of the triangle outside the cylinder of the reed switch body. These portions may, instead, be offset by about 90° each to define a rectangular shape with each surface mount foot defining at least three of the four respective sides of the rectangle outside the cylinder of the reed switch body.

The provision of rotationally offset surface mount feet allows the reed switch to be placed on the PC board in a greater number of rotational orientations about its longitudinal axis thereby simplifying manufacture of systems utilizing such components. Additionally, the outer or foot defining portions of the leads may be flattened or otherwise shaped at a location spaced from the body to further enhance the surface mount feet without requiring that a wide or flat lead extend out from the body. The transverse loops thus relieve the sensitive glass-to-metal seal of bending stresses while also providing a stable surface mount foot that serves to space the body of the switch from the PC board surface and provide improved isolation to the component from PC board transmitted vibration, thermal differential expansion and thermal shock. The loops at each end of the switch body may be bent in opposite directions relative one another so as to provide a symmetrical component, or they may be bent in like directions to define an asymmetric component.

By virtue of the foregoing, there is thus provided a surface mount electronic component, such as a surface mount reed switch, in which lead bending stresses may be avoided and in which a stable platform is provided to support the component on the PC board. These and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention, and together with the general description of the invention given above, and the detailed description of the embodiments given below, serve to explain the principles of the present invention.

DETAILED DESCRIPTION OF THE DRAWINGS

Figure 1:
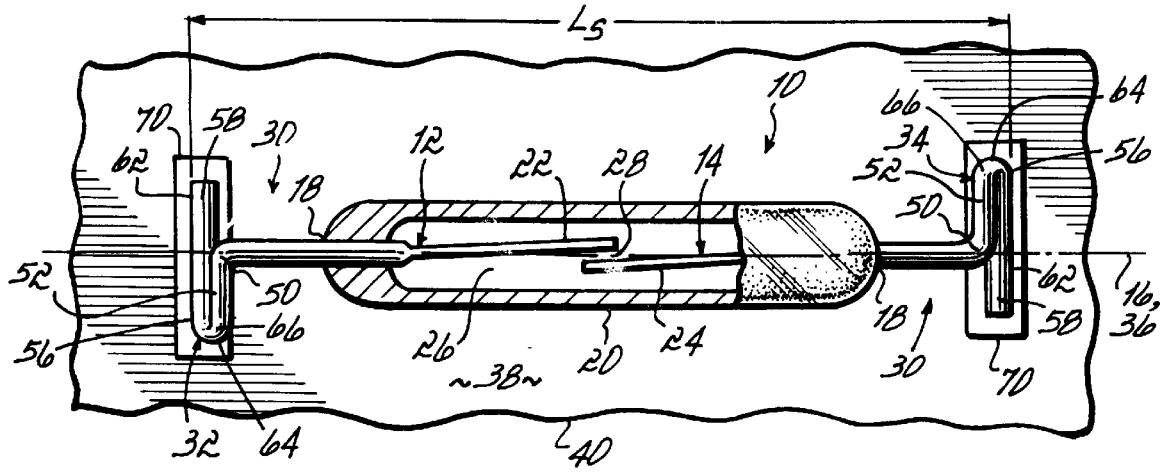
FIG. 1 is a top view, partially in cross-section, of a surface mount electronic reed switch component with oppositely bent C-shaped transverse lead wire loops in accordance with the principles of the present invention and setting on a PC board.
Figure 2:
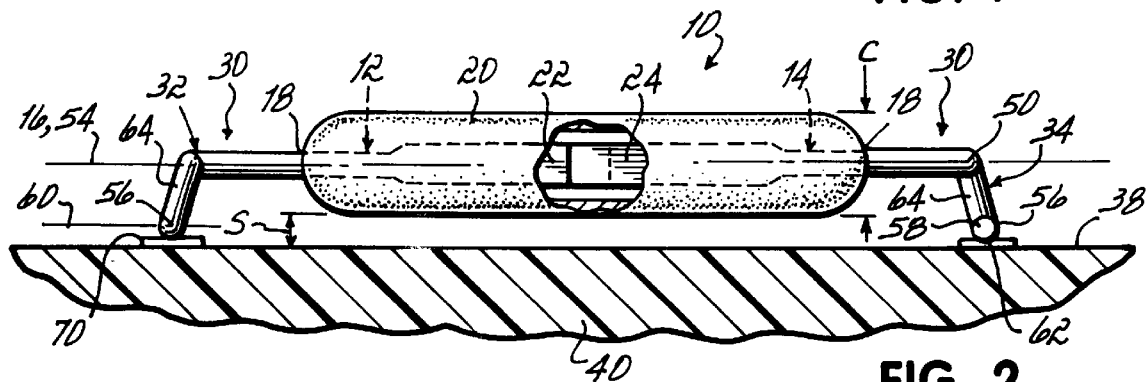
FIG. 2 is a front view of the component and PC board of FIG. 1.
Figure 3:
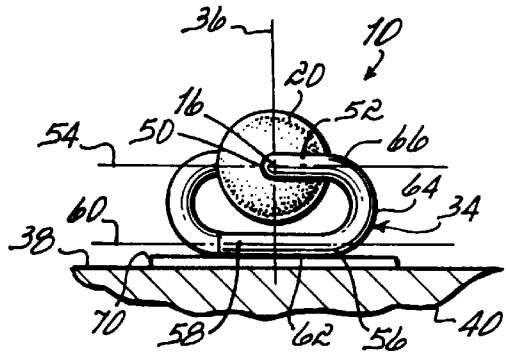
FIG. 3 is an end view of the component and PC board of FIG. 1.

With reference to FIGS. 1–3, there is shown a first embodiment of an electronic reed switch component 10 for purposes of explaining the principles of the present invention. Reed switch 10 includes a pair of conductive Alloy 51 nickel iron switch leads 12, 14 extending along longitudinal axis 16 out from opposite, hermetically sealed ends 18 of tubular, soda lime glass encapsulating body 20. The switch leads 12, 14 are sufficiently stiff such that the inner ends 22, 24 thereof may be canted within cavity 26 of body 20 so as to be disposed to opposite sides of longitudinal axis 16 as seen in FIG. 1 and define a gap 28 therebetween. The spacing of gap 28 defines the ampere-turn or sensitivity rating of reed switch 10 and thus must be carefully controlled. Typical gap spacing is between about one-half and three thousandths inch (about 0.015 and 0.08 millimeters).

Electronic component 10 is adapted for surface mounting by utilizing leads 12, 14 that define outer lead wire ends 30 exterior to body 20 that are formed or bent to define associated C-shaped transverse conductive loops 32, 34 as will now be described. More particularly, it will be appreciated that the inner ends 22, 24 of leads 12, 14 and body 20 define a seating plane 36 that extends through longitudinal axis 16 and is disposed in a vertical orientation relative to the top, horizontal surface 38 of PC substrate 40 (see FIG. 3). The loops 32, 34 each extend in a direction transverse to plane 36 and advantageously 90° thereto, for purposes hereinafter to be explained.

Right side loop 34 will be described, it being understood that in the embodiment shown herein, left-side loop 32 is the mirror image thereof. Loop 34 is defined by bending lead 14 adjacent body 20 (as shown by numeral 50) such that a first or proximal portion 52 thereof extends about 0.050 inches in a direction transverse to plane 36, and advantageously at an angle of about 90° thereto, so as to extend in a first horizontal plane 54 including axis 16 and perpendicular to plane 36. Lead 14 is bent a second time (as shown by numeral 56) such that a second or distal portion 58 of lead 14 extends below body 20 (outside the cylinder C thereof as seen in FIGS. 2 and 3) about 0.020 inches, and about 0.100 inches in a direction opposite to the first portion 52 so as to extend about 0.050 inches beyond plane 36. Portion 58 thus extends in a second horizontal plane 60 that is parallel to and below plane 54 and perpendicular to plane 36 such that the underside of portion 58 defines a surface mount foot 62 transverse to the seating plane 36 and outside the cylinder C of switch body 20 (FIG. 3). Lead 14 further includes a connector or bight portion 64 that defines the connection between portions 52 and 58 and may be part thereof. Bight portion 64 may be arcuate with an upper extent as at bend 66 and a lower extent as at bend 56 by which to extend obliquely from axis 16 between planes 54 and 60 so as to position second portion 58 not only below, but outwardly of, or laterally offset from, first portion 52 relative to body 20 as seen in FIG. 2. To this end, bend 66 may be selected such that bight portion 64 extends at an angle of about 10° from the vertical as seen in FIG. 2.

Figure 5:
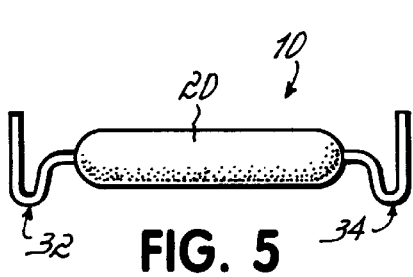
FIG. 5 is a diagrammatic top view of a third embodiment of a surface mount reed switch electronic component similar to the component of FIG. 1 showing the loops bent in like direction.

With reference to FIG. 1, it will be seen that component 10 is symmetrical. In other words, loop 32 is similar to loop 34 except that where loop 34 bends into and back out of the page in FIG. 2 (right and then left in FIG. 3), loop 32 extends in the opposite direction. Also, second or lower portion 58 of loop 34 is laterally offset from first or upper portion 52 to the right in FIG. 2 whereas the second portion 58 of loop 32 is laterally offset from first portion 52 thereof to the left in FIG. 2. Thus, it may be seen that loop 32 is a mirror image of loop 34 in that they are bent in opposite directions. Consequently, component 10 may be rotated so as to swap loops 32 and 34 on PC board 40 and it will appear to be the same, it is symmetrical. An asymmetric component may be formed by bending loop 32 in a like direction to that of loop 34 as depicted diagrammatically in FIG. 5.

By forming leads 12, 14 as above-described, the transverse loops 32, 34 each provide a surface mount foot 62 outside the cylinder of switch body 20 and extending in a direction transverse to seating plane 36. As a consequence, the width of leads 12, 14 is not determinative of the width of the foot. Rather, the length thereof in the second portion 58 defines the extent of the bearing surface that becomes the surface mount foot 62 and which rests on the contact pads 70 of the PC board substrate 40. As a result, the width of the bearing surface or surface mount foot 62 is relatively wide as compared to the diameter of the wire leads 12, 14 and is of sufficient width relative to the switch body 20 to properly support switch 10 on contact 70 of PC board surface 38. The transverse foot 62 as above-described also provides improved isolation to the switch 10 from PC board transmitted vibration, thermal differential expansion and thermal shock.

Figure 4:
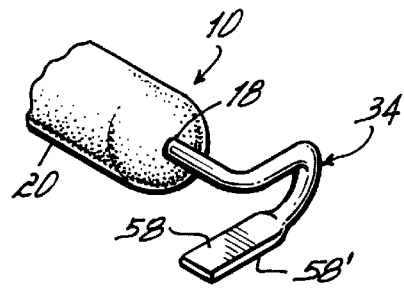
FIG. 4 is a perspective, partial view of a second embodiment of a surface mount reed switch electronic component similar to the component of FIG. 1 with a shaped surface mount foot.

To further stabilize component 10, distal or board-forcing portion 58 leads 12, 14 spaced well away from body 20 along the length of the lead wire may be flattened or otherwise shaped such as shown in FIG. 4. As seen there, C-shaped loop 32 or 34 may be modified by coining or other metal forming techniques such that portion 58 is flattened to about 0.010" thick at 58' to present a wider bearing surface (about 0.025 inches) for the surface mount foot function.

As will be readily appreciated from the foregoing, portions 58 define the PC board-facing aspect of loops 32, 34 thus allowing the component 10 to be rotationally orientated about axis 16 as shown to mate with PC board contacts 70. Other lead wire loop configurations may be provided such as encircling loops which allow for greater flexibility in mounting component 10. To this end, the transverse loops may be constructed to have shapes other than or additional to the C-shape described above so as to have additional board-facing portions or surface mount feet. By way of example, the loops could be formed in a triangular shape or rectangular or square shape as will now be described with respect to FIGS. 6 and 7, respectively (with the loop at one end being described it being appreciated that the loop at the other end will generally be similarly formed to bend in the same or opposite direction as described above for loops 32, 34).

Figures 6, 7:
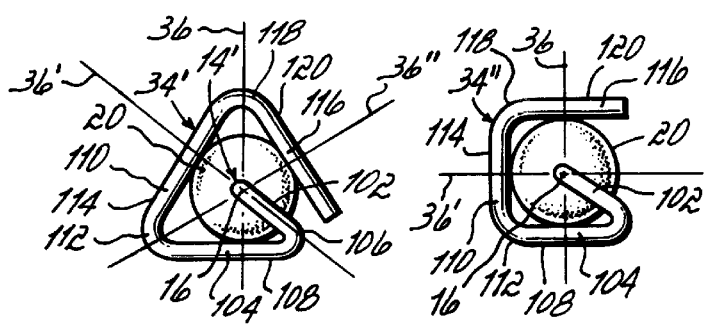
FIG. 6 is an end view of a fourth embodiment of a surface mount reed switch electronic component similar to the component of FIG. 1 with a triangular-shaped transverse lead wire loop in accordance with the principles of the present invention.
FIG. 7 is an end view of a fifth embodiment of a surface mount reed switch electronic component similar to the component of FIG. 1 with a rectangular-shaped transverse lead wire loop in accordance with the principles of the present invention.

Turning to FIG. 6, lead wire 14' is bent adjacent body 20 so as to extend transverse to seating plane 36 in a direction along a line about 120° from seating plane 36 to define a first portion 102. A second portion 104 is bent from first portion 102 as at bight portion bend 106 at an angle of about 120° in a direction generally opposite that of the first portion 102 and generally perpendicular to seating plane 36 to extend therebeyond and define first surfacing mount foot 108 transverse to seating plane 36 similar to second portion 58 of loop 34. A third portion 110, is bent from second portion 104 as at 112 to approximately 120° to bend back toward seating plane 36 and/or body 20 thereby defining a second surface mount foot 114 rotationally offset from surface mount foot 108. Finally, a fourth portion 116 is bent from third portion 110 as at 118 to an angle of 120° so as to bend again back towards body 20 and define a third surface mounting foot 120 rotationally offset from both surface mount feet 108 and 114. It will be seen that all three feet 108, 114 and 120 are in a common plane perpendicular to seating plane 36 and define the legs of a triangular shaped loop 34'. It will also be seen that body 20 may be rotated in 120° increments about axis 16 so as to bring any one of the three surface mounting feet, 108, 110 or 120, into board-facing relationship with PC board 40. When surface mount foot 110 or 120 is facing board 20, it will be seen that an imaginary seating plane 36' or 36", respectively, is created with the surface mounting foot being transverse thereto and advantageously at an angle of 90° relative to that seating plane.

Alternatively, the third and fourth portions 110 and 116 may be bent back toward body 20 from the second and third portions 104 and 110, respectively, at an angle of 90° rather than 120° so as to define a generally rectangular or square shape loop 34" as seen FIG. 7. In this embodiment, body 20 may be rotated in 90° increments so as to bring any one of surface mount feet 108, 114, or 120 into board-facing or confronting relationship with PC board 40. To this end, a further portion (not shown) may be provided to define a surface mount foot parallel to foot 114. Where surface mount feet 108 or 120 are facing the board, it will be seen that the feet are transverse to seating plane 36. Where surface mount foot 114 is facing board 40 (or spaced from but parallel thereto), it will seen that an imaginary seating plane 36' is defined with surface mount foot 114 transverse thereto.

While FIGS. 6 and 7 show loop 34' and 34", respectively, at one end of switch body 20, it will be appreciated that comparable loops, which either bend in opposite directions for a symmetrical component or like directions for an asymmetrical component as described above for loops 32 and 34, are provided at the other end of body 20.

To match up to the PC board contacts 70, outer lead wire portions 58 are offset relative to first portions 52 by oblique bight portions 64. By way of example, and not limitation, loops 32, 34 are formed such that the overall length ($L_s$) of component 10 is about 0.7 to 1.0 inches (about 17.7 to 25.3 mm) as desired for surface mounting of switch 10. However, bends 50, 56 and/or 66 may be adjusted or located as desired to effectively change the angle of inclination of bight portions 64 so as to accommodate and control the overall length as necessary to fit the specific application. Similarly, first portion 102 in the embodiment of FIGS. 6 and 7 may be angled obliquely from body 20 so as to offset the surface mount feet laterally from body 20. As a consequence, there is greater flexibility in defining $L_S$ so as to achieve any desired longitudinal spacing between a mounting foot surface and glass body 20. Such flexibility is of significant advantage when different size components are desired.

By providing surface mount feet transverse to switch body 20 such as with transversely-extending loops as above-described, the stresses of bending are reduced or eliminated thereby avoiding adverse affects on the hermetic seal of body 20 or on gap 28 but without the need for separate pad elements. Additionally, greater flexibility in defining clearance (S) of body 20 relative to PC board surface 38 is provided by the present invention. To this end, such clearance may be preselected simply by selection of location of the various bends in the lead wires 12, 14.

In use, the component 10 is formed using conventional techniques. Loops 32, 34 are associated with leads 12, 14 by appropriate bending of the outer aspects 30 thereof to be adapted for surface mounting. The component is then able to be surface mounted to PC board 40 by placing the desired lead wire portion such as portions 58, on a respective pad contact 70 of the board 40 after which solder may be applied as is conventional.

By virtue of the foregoing there is thus provided an electronic component, such as a reed switch, which is SMT compatible without certain drawbacks associated with prior art SMT components. To this end, a surface mount electronic component is provided which does not require unnecessary bending stresses on the leads thereof, and which can provide a stable mounting surface for the component when it is resting on the PC board surface prior to being soldered into place.

While the illustrative embodiments have been described in considerable detail, additional advantages and modifications will readily appear to those skilled in the art. By way of example, while switch body 20 is shown as round in cross-section, it could be rectangular or some other shape. The periphery of the component, such as in cross-section, thus defines the cylinder thereof outside of which the switch mount foot lies. Also, although the invention is described with particular reference to a surface mount reed switch, it has applicability to other electronic components as will be readily appreciated by those skilled in the art. The invention in its broader aspects is, therefore, not limited to the specific details, representative apparatus and method, and illustrative examples shown and described. Accordingly, departures may also be made from such details without departing from the spirit or scope of the general invention.

Having described the invention, what is claimed is:

1. A surface mount electronic component comprising:
a reed switch having a reed switch body defining a cylinder and a pair of switch lead wires extending out of the reed switch body along a seating plane of the reed switch such that inner ends of the switch lead wires define a switch gap within the reed switch body and along the seating plane; and
a conductive loop associated with each of the lead wires outside of the reed switch body, each conductive loop extending transverse to the seating plane so as to provide for each lead wire a surface mount foot spaced outside the reed switch body and extending in a direction transverse to the seating plane.

2. The surface mount electronic component of claim 1 wherein each of the conductive loops includes a first portion adjacent the reed switch body, and a second portion spaced from the reed switch body, the second portion defining the surface mount foot, each portion extending transverse to the seating plane.

3. The surface mount electronic component of claim 2 wherein the first portion is bent adjacent the reed switch body to extend in a direction transversely outward from the seating plane and the second portion is bent to extend outside the reed switch body and in a direction generally opposite to the first portion so as to define a first surface mount foot transverse to the seating plane outside the reed switch body.

4. The surface mount electronic component of claim 2 wherein each of the conductive loops further includes a bight portion interconnecting the first and second portions.

5. The surface mount electronic component of claim 4, the second portion being laterally offset from the first portion.

6. The surface mount electronic component of claim 4, the first and second portions being laterally offset by the bight portion.

7. The surface mount electronic component of claim 4 wherein the bight portion extends obliquely away from the reed switch body to laterally offset the second portion from the first portion.

8. The surface mount electronic component of claim 2, the second portion being laterally offset from the first portion.

9. The surface mount electronic component of claim 2 wherein the first and second portions extend at an angle of about ninety degrees relative to the seating plane.

10. The surface mount electronic component of claim 2 wherein each of the conductive loops includes at least a third portion outside the reed switch body extending from the second portion in a direction back toward the reed switch body so as to define a second surface mount foot outside the reed switch body and rotationally offset from the first surface mount foot.

11. The surface mount electronic component of claim 10 wherein each of the conducive loops includes at least a fourth portion outside the reed switch body extending from the third portion in a direction back toward the reed switch body so as to define a third surface mount foot outside the reed switch body and rotationally offset from the first and second surface mount feet.

12. The surface mount electronic component of claim 11 wherein the second, third and fourth portions cooperate to define a triangular shape to the conductive loop such that each respective surface mount foot corresponds to a respective leg of the triangular shaped loop.

13. The surface mount electronic component of claim 11 wherein the second, third, and fourth portions cooperate to define a rectangular shape to the conductive loop such that each respective surface mount foot corresponds to a respective side of the rectangular shaped loop.

14. The surface mount electronic component of claim 1 wherein each of the conductive loops has a plurality of portions outside the reed switch body, each rotationally offset from the other, to provide for each lead wire a plurality of rotationally offset surface mount feet spaced outside the reed switch body.

15. The surface mount electronic component of claim 14, each of the conductive loops having three such portions formed in a triangular shape to define three rotationally offset surface mount feet outside the reed switch body.

16. The surface mount electronic component of claim 14, each of the conductive loops having at least three such portions formed in a rectangular shape to define rotationally offset surface mount feet outside the reed switch body.

17. The surface mount electronic component of claim 1 wherein each of the conductive loops is defined by an open-shaped loop of each lead wire having a single bottom portion to provide the surface mount foot.

18. The surface mount electronic component of claim 1, each of the conductive loops being formed in a C-shape.

19. The surface mount electronic component of claim 1 wherein each of the surface mount feet extends at an angle of approximately ninety degrees relative to the seating plane.

20. The surface mount electronic component of claim 1 wherein the conductive loops extend in opposite directions relative to one another.

21. The surface mount electronic component of claim 1 wherein the conductive loops extend in like directions relative to one another.

22. A surface mount electronic component comprising:
a component body having a conductive lead wire extending outwardly therefrom along an axis, the axis lying along an intersection between a seating plane of the component and a horizontal plane extending perpendicular to the seating plane; and
a conductive loop associated with the lead wire outside of the body and extending transverse to the seating plane so as to provide a surface mount foot spaced outside the component body and spaced from the second plane, and extending in a direction transverse to the seating plane.

23. The surface mount electronic component of claim 22 wherein the conductive loop includes a first portion adjacent the component body, and a second portion spaced from the component body, the second portion defining the surface mount foot, each portion extending transverse to the seating plane.

24. The surface mount electronic component of claim 23 wherein the first portion is bent adjacent the component body to extend in a direction transversely outward from the seating plane and the second portion is bent to extend outside the component body and in a direction generally opposite to the first portion so as to define a first surface mount foot transverse to the seating plane outside the component body.

25. The surface mount electronic component of claim 23 wherein the conductive loop further includes a bight portion interconnecting the first and second portions.

26. The surface mount electronic component of claim 25, the second portion being laterally offset from the first portion.

27. The surface mount electronic component of claim 25, the first and second portions being laterally offset by the bight portion.

28. The surface mount electronic component of claim 25 wherein the bight portion extends obliquely away from the component body to laterally offset the second portion from the first portion.

29. The surface mount electronic component of claim 23, the second portion being laterally offset from the first portion.

30. The surface mount electronic component of claim 23 wherein the first and second portions extend at an angle of about ninety degrees relative to the seating plane.

31. The surface mount electronic component of claim 23 wherein the conductive loop includes at least a third portion outside the component body extending from the second portion in a direction back toward the component body so as to define a second surface mount foot outside the component body and rotationally offset from the first surface mount foot.

32. The surface mount electronic component of claim 31 wherein the conductive loop includes at least a fourth portion outside the component body extending from the third portion in a direction back toward the component body so as to define a third surface mount foot outside the component body and rotationally offset from the first and second surface mount feet.

33. The surface mount electronic component of claim 32 wherein the second, third and fourth portions cooperate to define a triangular shape to the conductive loop such that each respective surface mount foot corresponds to a respective leg of the triangular shaped loop.

34. The surface mount electronic component of claim 32 wherein the second, third, and fourth portions cooperate to define a rectangular shape to the conductive loop such that each respective surface mount foot corresponds to a respective side of the rectangular shaped loop.

35. The surface mount electronic component of claim 22 wherein the conductive loop has a plurality of portions outside the component body, each rotationally offset from the other, to provide for the lead wire a plurality of rotationally offset surface mount feet spaced outside the component body.

36. The surface mount electronic component of claim 35, the conductive loop having three such portions formed in a triangular shape to define three rotationally offset surface mount feet outside the component body.

37. The surface mount electronic component of claim 35, the conductive loop having at least three such portions formed in a rectangular shape to define rotationally offset surface mount feet outside the component body.

38. The surface mount electronic component of claim 22 wherein the conductive loop is defined by an open-shaped loop of the lead wire having a single bottom portion to provide the surface mount foot.

39. The surface mount electronic component of claim 22, the conductive loop being formed in a C-shape.

40. The surface mount electronic component of claim 22 wherein the surface mount foot extends at an angle of approximately ninety degrees relative to the seating plane.

41. The surface mount electronic component of claim 1, wherein the switch lead wires extend out of the reed switch body along an axis lying along an intersection between the seating plane and a horizontal plane extending perpendicular to the seating plane, and wherein the surface mount foot is spaced from the horizontal plane.

* * * * *